United States Patent
Yamazaki

(10) Patent No.: US 6,627,957 B1
(45) Date of Patent: *Sep. 30, 2003

(54) SEMICONDUCTOR DEVICE AND FABRICATION METHOD THEREOF

(75) Inventor: Shunpei Yamazaki, Tokyo (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/328,311

(22) Filed: Jun. 8, 1999

Related U.S. Application Data

(62) Division of application No. 08/965,907, filed on Nov. 7, 1997.

(30) Foreign Application Priority Data

Nov. 8, 1996 (JP) .............................................. 8-312850

(51) Int. Cl.[7] .............................................. H01L 29/76
(52) U.S. Cl. .................... 257/364; 257/59; 257/350; 257/364; 257/365; 257/377; 257/401
(58) Field of Search ................................. 257/369, 364, 257/377, 401, 59, 350, 365, 72, 347

(56) References Cited

U.S. PATENT DOCUMENTS

| | | | | |
|---|---|---|---|---|
| 4,917,467 A | * | 4/1990 | Chen et al. | 350/332 |
| 5,338,959 A | * | 8/1994 | Kim et al. | 257/331 |
| 5,378,913 A | * | 1/1995 | Hoeltge | 257/365 |
| 5,589,702 A | * | 12/1996 | Alter | 257/379 |
| 5,616,935 A | | 4/1997 | Koyama et al. | 257/69 |
| 5,644,147 A | * | 7/1997 | Yamazaki et al. | 257/66 |
| 5,789,781 A | | 8/1998 | McKitterick | 257/347 |
| 5,789,791 A | * | 8/1998 | Bergemont | 257/401 |
| 5,808,595 A | * | 9/1998 | Kubota et al. | 345/92 |
| 5,811,846 A | * | 9/1998 | Miura et al. | 257/291 |
| 5,821,560 A | * | 10/1998 | Arai et al. | 257/57 |
| 5,949,111 A | * | 9/1999 | Morikawa et al. | 257/369 |
| 6,020,598 A | * | 2/2000 | Yamazaki | 257/59 |

* cited by examiner

*Primary Examiner*—Sheila V. Clark
*Assistant Examiner*—Edgardo Ortiz
(74) *Attorney, Agent, or Firm*—Fish & Richardson P.C.

(57) ABSTRACT

To provide a semiconductor device restraining high frequency impedance and restraining deterioration of a semiconductor layer, a gate wiring 26 is extended while meandering and intersects with a substantially straight line portion of a semiconductor layer 02 by a plurality of times thereby providing a plurality of gates.

72 Claims, 5 Drawing Sheets

SEMICONDUCTOR DEVICE AND FABRICATION METHOD THEREOF

This is a divisional of U.S. application Ser. No. 08/965,907, filed Nov. 7, 1997.

BACKGROUND OF THE INVENTION

1. Field of the Invention

The present invention disclosed in the specification relates to a semiconductor device constituted by using a thin film transistor having a plurality of gate electrodes. Further, the present invention relates to a method of fabricating the semiconductor device.

2. Description of Related Art

In recent years, there has been increased thin film transistors using polycrystal silicon films in semiconductor layers. According to a thin film transistor using a polycrystal silicon film, high speed operation that is faster than operation of a thin film transistor using an amorphous silicon film by two digits or more can be performed since a mobility thereof is large.

Therefore, there poses a problem of hot carrier effect in which hot carriers generated in a channel jump into a gate insulating film and deteriorate a threshold voltage or a mutual conductance.

Conventionally, in respect of the above-described problem, there has been known a thin film transistor of a multi gate type alleviating the hot carrier effect by providing a plurality of gate electrodes and weakening an electric field applied on a single gate.

FIG. 5 shows an example where a thin film transistor of a conventional double gate type is used as a switching element of a pixel matrix portion of a liquid crystal display device.

As shown by FIG. 5, a semiconductor layer 02 and a source wiring 25 form a contact at a source electrode 22. Further, the semiconductor layer 02 is extended while meandering and intersects with a gate wiring 26 at regions 21 and 21'. Further, the semiconductor layer 02 and a pixel electrode 24 form a contact at a drain electrode 23. Portions of the gate wiring at the intersected regions 21 and 21' function as gate electrodes.

As is an apparent from FIG. 5, the conventional multi gate type thin film transistor is constituted by the gate wiring 26 in a substantially straight line shape and the meandering semiconductor layer 02.

By adopting such a constitution, a distance between the source and the drain is prolonged and therefore, the ON resistance is increased. Further, the resistance of a semiconductor layer is generally larger than that of a metal conductor and therefore, in respect of the semiconductor layer 02 meandering as shown by FIG. 5, the high frequency impedance of the meandering portion is increased which gives rise to deterioration of the element.

It is the object of the present invention disclosed in the specification to resolve the above-described problem.

SUMMARY OF THE INVENTION

According to an aspect of the present invention disclosed in the specification, there is provided a semiconductor device, wherein a meandering gate wiring traverses a substantially straight line portion of a semiconductor layer of a thin film transistor by a plurality of times thereby providing a plurality of gates.

According to other aspect of the present invention, there is provided a semiconductor device, wherein a switching element of a pixel matrix portion of a liquid crystal display device is a multi gate type thin film transistor in which a meandering gate wiring traverses a substantially straight line portion of a semiconductor layer by a plurality of times thereby providing a plurality of gates.

Further, the above-described gate wiring is featured in comprising a metal having the resistance smaller than the resistance of the semiconductor layer.

According to other aspect of the present invention, there is provided a method of fabricating a semiconductor device including a step of forming a semiconductor layer having a substantially straight line portion on a substrate, a step of forming a gate insulating film and a metal conductive film above the semiconductor layer, a step of patterning the metal conductive film into a gate wiring, a step of doping impurities to the semiconductor layer with the gate wiring as a mask and a step of irradiating a laser beam wherein the gate wiring meanders and intersects the substantially straight line portion of the semiconductor layer by a plurality of times.

According to the present invention, the gate comprising a metal having small resistance is meandered and therefore, an increase in impedance in the resistance imposed on the meandering portion is small. Further, there is no meandering portion in the semiconductor layer and therefore, deterioration by heat generation or the like can be restrained.

Further, the distance between the source and the drain is shortened compared with that in the conventional example and therefore, the ON resistance can be reduced and the thin film transistor having high mobility can be fabricated.

DETAILED DESCRIPTION OF THE PREFERRED EMBODIMENTS

Figure 1:
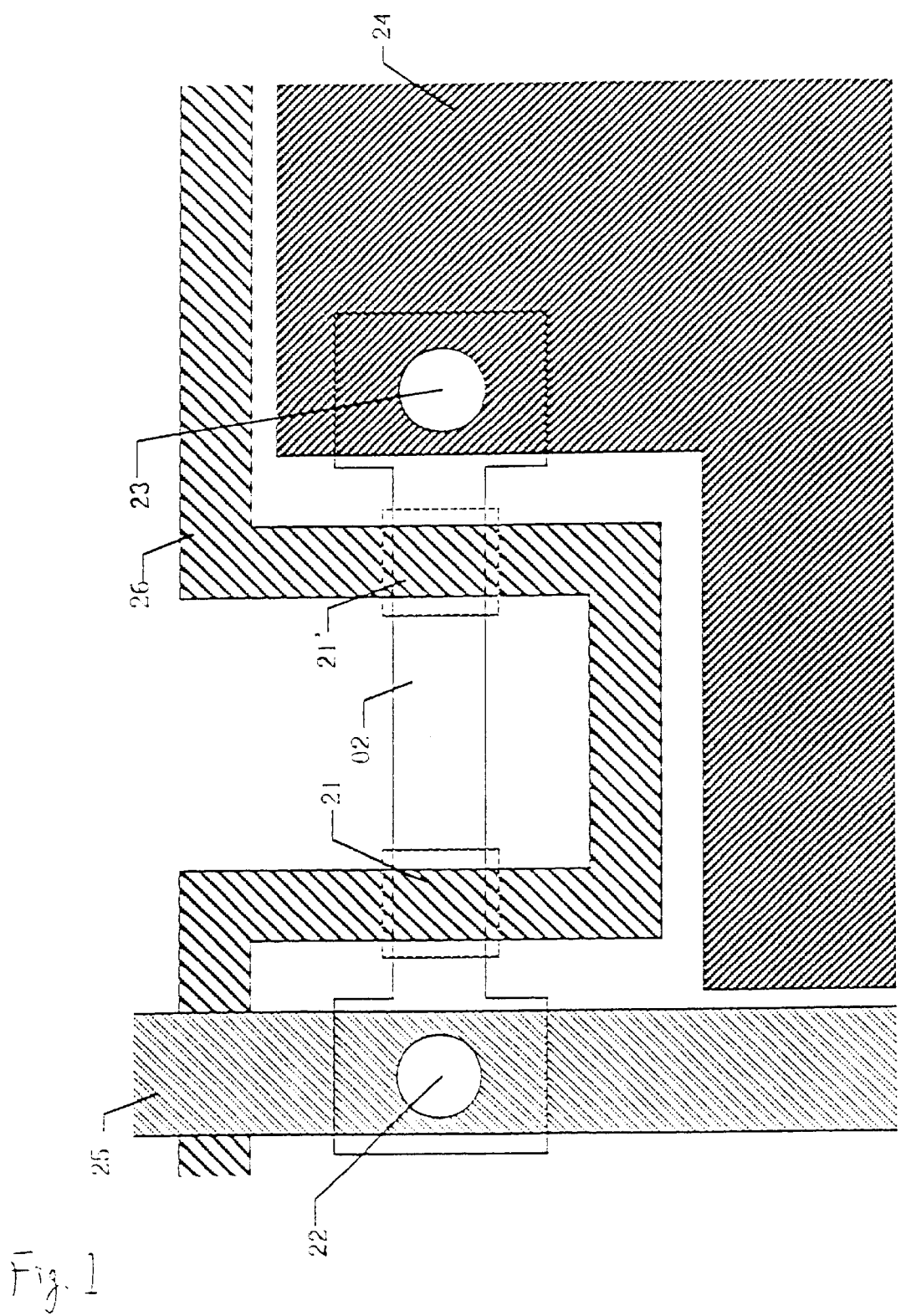
FIG. 1 is a top view of a pixel matrix portion constituted by using the present invention.

FIG. 1 shows an example of using a thin film transistor according to the present invention in a switching element of a pixel matrix portion of a liquid crystal display device.

A contact is formed by a source wiring 25 and a semiconductor layer 02 at a source electrode 22. Further, the semiconductor layer 02 which is extended in a substantially straight line shape and a gate wiring 26 intersect with each other at portions 21 and 21'.

Further, a contact is formed by the semiconductor layer 02 and a pixel electrode 24 at a drain electrode 23. A field effect transistor is constituted by forming gate electrodes at the regions 21 and 21' where the meandering gate electrode 26 intersects with the semiconductor layer 02.

FIGS. 2(A), 2(B), 2(C) and 2(D) show steps of fabricating the semiconductor device shown by FIG. 1.

First, a semiconductor layer 02 is formed on an insulating substrate 01. Next, a gate insulating film 10 is formed on the semiconductor layer and on top of the gate insulating film 10, a metal conductive film 20 for constituting a gate wiring is formed all over the face. Further, the surface of the metal conductive film 20 is oxidized by an anodic oxidation process thereby forming an upper anodically oxidized film 11.

Figure 2:
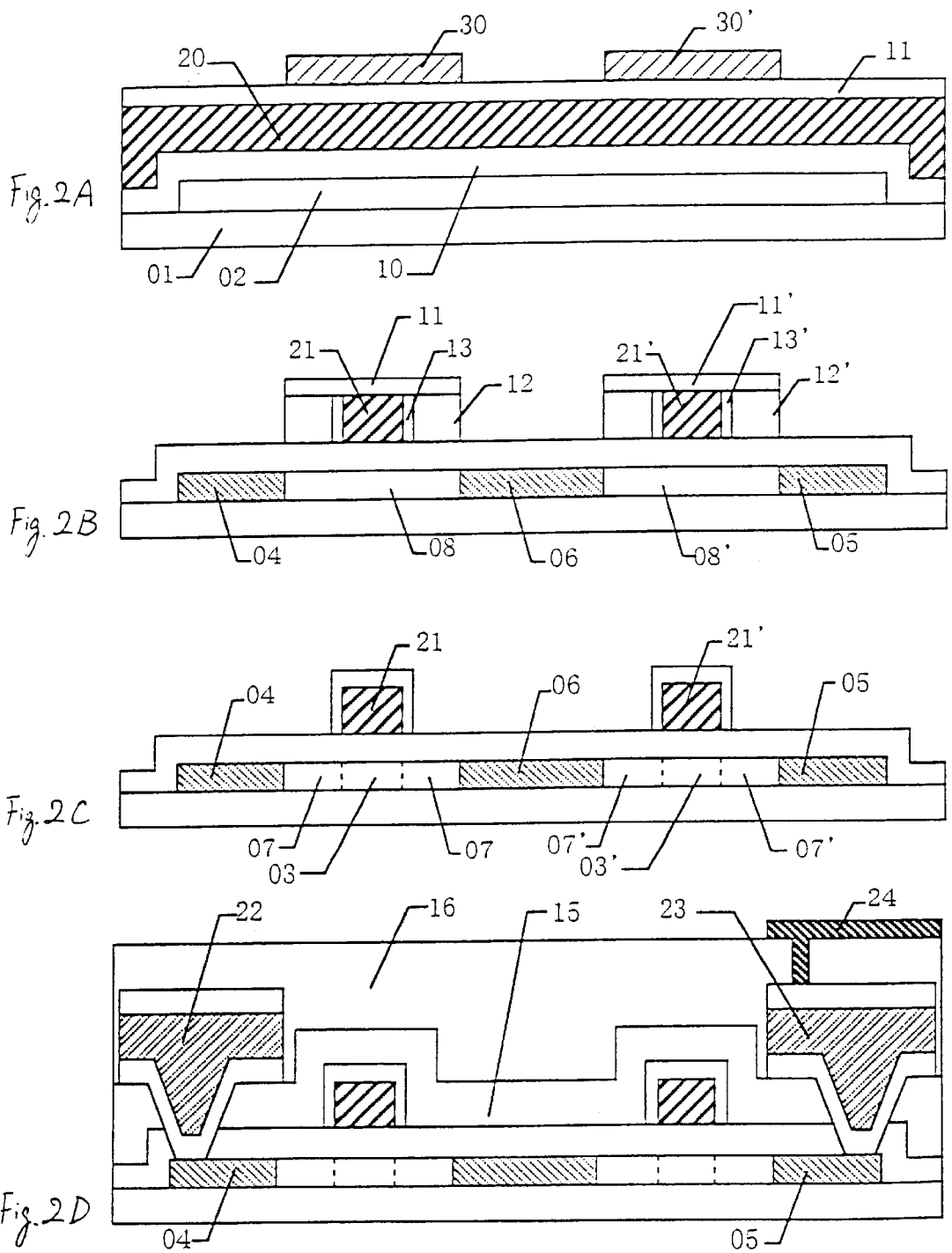
FIGS. 2A, 2B, 2C and 2D are views showing steps of fabricating a pixel matrix portion constituted by using the present invention.

Further, a resist mask is coated on the upper anodically oxidized film 11 and patterning is performed in a form of the gate wiring thereby providing portions 30 and 30'. In this way, a state of FIG. 2(A) is produced. Further, the gate wiring is formed by etching the upper anodically oxidized film 11 and portions of the metal conductive film 20 which are not covered by the resist mask. Successively, the anodic oxidation process is performed again on the gate wiring by which porous anodically oxidized films 12 and 12' and anodically oxidized films 13 and 13' having a dense film quality are formed. At the same time, gate electrodes 21 and 21' are formed.

Under this state, impurities are added by which a source region 04, a drain region 05 and an impurity added region 06 are formed. In this way, a state shown by FIG. 2(B) is produced. Next, the porous anodically oxidized films 12 and 12' are removed. In this way, a state shown by FIG. 2(C) is produced. That is, there is formed a thin film transistor of a double gate type having a semiconductor layer in which channel regions 03 and 03' are formed below the respective gate electrodes 21 and 21' and offset regions 07 and 07' are formed contiguous to the channel regions.

Thereafter, a first interlayer insulating film 15 is formed all over the face, contact holes are opened at the source region 04 and the drain region 05 and a source electrode 22 and a drain electrode 23 are formed. Incidentally, the source electrode is constituted by a portion of a source wiring. Further, a second interlayer insulating film 16 is formed and a contact hole for the drain electrode 23 and a pixel electrode 24 is formed. Next, the pixel electrode 24 is formed. In this way, as shown by FIG. 2(D), the thin film transistor that is a switching element of an active matrix device.

EMBODIMENT 1

FIGS. 2(A), 2(B), 2(C) and 2(D) show fabrication steps of the embodiment. According to the embodiment, there are shown steps of fabricating on a glass substrate a thin film transistor that is a switching element of a pixel matrix portion.

Although in this embodiment, a glass substrate is used as a substrate, a quartz substrate, a semiconductor substrate having an insulating surface may be used in place of the glass substrate.

First, an underlayer protective film, not illustrated, is formed on a glass substrate 01. The underlayer protective film contributes to prevention of diffusion of impurities from the substrate, relaxation of thermal stress of the thin film transistor and relaxation of internal stress. According to the embodiment, a silicon oxide film is formed by a film thickness of 2000 Ụ as the underlayer protective film through a sputtering process.

Next, a semiconductor layer is formed. In the embodiment, a silicon film is used as the semiconductor. Although a plasma CVD (Chemical Vapor Deposition) process, a low pressure thermal CVD process and the like may be used as methods of fabricating a silicon film, in this embodiment, an amorphous silicon film of I type (intrinsic or substantially intrinsic electric conductiveness) is formed by a plasma CVD process. The film thickness of the silicon film falls in a range of 300 through 1000 Ụ and according to the embodiment, the silicon film is formed by a film thickness of 500 Ụ.

Further, according to the embodiment, the amorphous silicon film is crystallized to constitute polycrystals. Although as crystallization processes, there are a thermal crystallization process and a crystallization process using a laser beam, according to the embodiment, the crystallization is performed by using a laser beam. Naturally, when an amorphous silicon is used as a semiconductor layer, the step of crystallization is not needed.

Patterning is performed on the polycrystal silicon film formed as described above, by which a pattern designated by numeral 02 of FIG. 2(A) is formed. Next, a gate insulating film 10 is formed on the semiconductor layer 02. A silicon oxide film, a silicon nitride film, a silicon oxinitride film or a laminated film of these or the like is used as the gate insulating film 10. In this embodiment, a silicon oxinitride film is formed by the plasma CVD process using TEOS (tetraethylorthosilicate) and $N_2O$ as raw materials. The film thickness of the gate insulating film falls in a range of 500 through 2000 Ụ and according to the embodiment, the gate insulating film is formed with a film thickness of 1200 Ụ.

Next, an aluminum film having a film thickness of 3000 through 10000 Ụ, or 4000 Ụ in this embodiment is formed on the gate insulating film 10 by a sputtering process as a metal conductive film 20. The metal conductive film 20 constitutes a gate wiring in later steps.

In forming the aluminum film, an aluminum alloy target including a substance of silicon, scandium or the like by 0.1 through 5.0 weight % is used. In this embodiment, the aluminum film is formed by using a target including 0.2 weight % of scandium.

Scandium is included to restrain formation of projections referred to as hillocks or whiskers by abnormal growth of aluminum in a later thermal step at 100° C. or higher.

Although in the embodiment, an aluminum alloy is used for the metal conductive film, a Cr film, a Ti film, a Ta film, a MoTa film or a laminated film of these may be used.

Next, an anodic oxidation using tartaric acid as an electrolyte is performed with the aluminum film 20 as an anode. By this step, an upper anodically oxidized film 11 is formed on the surface of the aluminum film 20 with a film thickness of 100 Ụ.

The upper anodically oxidized film 11 functions to restrain occurrence of hillocks or whiskers in later steps. Further, the anodically oxidized film also functions to prevent shortcircuit in the vertical direction between the metal conductive film for constituting a gate wiring and a wiring arranged thereabove.

Next, a resist mask is coated on the anodically oxidized film 11. Further, the resist mask is patterned in a form of a gate wiring. In this way, resist patterns 30 and 30' are formed.

When a state shown by FIG. 2(A) is produced in this way, the anodically oxidized film 11 and the aluminum film 20 are etched into the shape of a gate wiring by using the resist masks 30 and 30'.

Successively, anodic oxidization is performed with the gate wiring as an anode. In this case, oxalic acid is used for an electrolytic solution under the following conditions.

| | |
|---|---|
| Voltage | 8 V |
| Temperature | 30° C. |
| Time | 40 minutes |

In this way, the porous anodically oxidized films designated by notations 12 and 12' of FIG. 2(B) are formed. In the anodic oxidation, the porous anodically oxidized film is not formed at the upper portion of the gate wiring since the upper anodically oxidized films 11 and 11' remain thereabove.

Next, further anodic oxidation is performed. In the anodic oxidation, tartaric acid is used for an electrolytic solution under the following condition.

| | |
|---|---|
| Voltage | 100 V |
| Temperature | 10° C. |
| Time | 45 minutes |

In this way, anodically oxidized films 13 and 13' having a dense film quality are formed between side walls of the gate electrodes and the porous anodically oxidized films 12 and 12'. Thus, gate electrodes 21 and 21' are formed at portions where the gate wiring intersects with the semiconductor layer.

The dense anodically oxidized films 13 and 13' are formed to prevent aluminum constituting the gate wiring from being etched by an etchant in removing the porous anodically oxidized films 12 and 12'.

Next, impurities are doped with the gate electrodes 21 and 21' formed with the anodically oxidized films as masks. As processes of doping impurities, there are a plasma doping process and an ion implantation process. In this embodiment, impurities are doped by a plasma doping process that is also adaptable to a large area.

In the embodiment, a thin film transistor having an N type conductiveness is formed by doping phosphorus as an impurity. A thin film transistor having a P type conductiveness may be fabricated by doping boron in place of phosphorus.

In this way, as shown by FIG. 2(B), a source region 04, a drain region 05 and a N type region 06 added with impurities are formed. At the same time, I type regions 08 and 08' which have not been added with impurities due to presence of the gate electrodes 21 and 21' remain.

Next, the porous anodically oxidized films 12 and 12' are removed. The etching is performed by the wet etching process using an etchant mixed with acetic acid, nitric acid, phosphoric acid and water. Further, the source region 04, the drain region 05 and the N type region 06 which become amorphous by being doped with phosphor, are irradiated with a laser beam.

By irradiating the laser beam, the regions 04, 05 and 06 doped with impurities are activated and crystallized. In this embodiment, an excimer laser is used as a laser beam.

In this way, a state as shown by FIG. 2(C) is produced. In this case, regions below the gate electrodes 21 and 21' constituting the I type layers, become channel regions 03 and 03'. Further, the I type regions which are made to remain by presence of the porous anodically oxidized films 12 and 12' and the dense anodically oxidized films 13 and 13', become offset regions 07 and 07'.

Next, a silicon nitride film is formed as a first interlayer insulating film 15 by a film thickness of 3000 ∪ through a plasma CVD process. Although in the embodiment, the silicon nitride film is used for the first interlayer insulating film 15, a silicon oxide film, a silicon oxinitride film or a laminated film of these may be used.

Further, contact holes are perforated at the source region 04 and the drain region 05. Then, a source electrode 22 and a drain electrode 23 are formed. Incidentally, a source wiring is extended from the source electrode.

In this embodiment, the source wiring and the drain electrode are formed by forming three layers film of a titanium film, an aluminum film and a titanium film by a sputtering process and patterning the three layers film.

Next, a second interlayer insulating film 16 is formed. In this embodiment, a laminated film of a silicon nitride film and a polyimide film is used as the second interlayer insulating film 16. Further, a contact hole is formed at the drain electrode 23 and a pixel electrode 24 is formed as shown by FIG. 2(D).

In this embodiment, the pixel electrode 24 is formed by forming an ITO (Indium Tin Oxide) film by a thickness of 1000 Å through a sputtering process and patterning it. Finally, the thin film transistor is hydrogenerated and the wiring is sintered by performing a heating treatment in a hydrogen atmosphere at 350° C.

In this way, a pixel matrix portion of a liquid crystal display device is finished as shown by FIG. 2(D). Although in the embodiment, only the offset regions are formed, lightly doped impurity regions may be formed by adding impurities at a low concentration after removing the porous anodically oxidized films 12 and 12'.

EMBODIMENT 2

Figure 3:
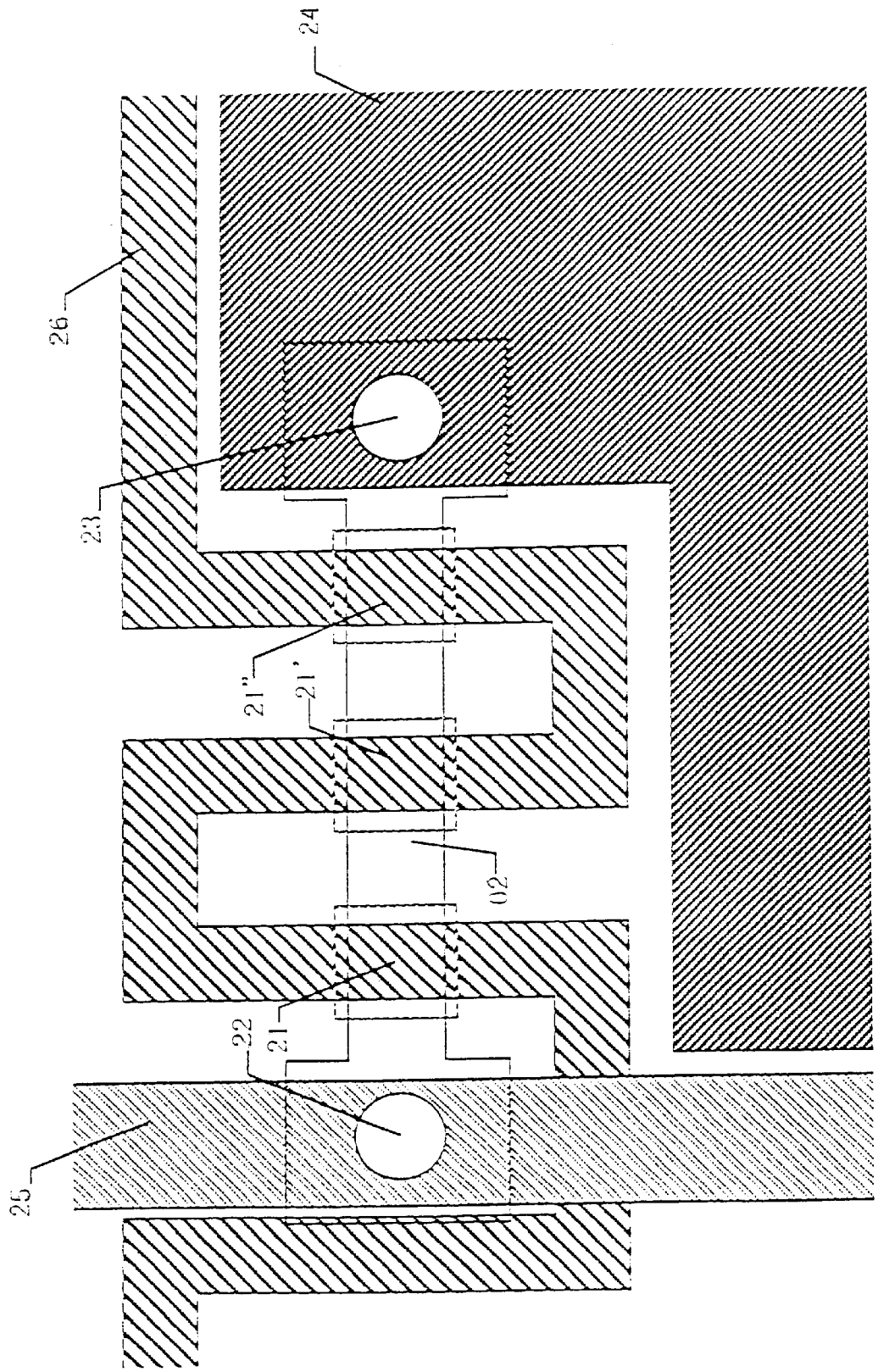
FIG. 3 is a top view of a pixel matrix portion constituted by using the present invention.

This embodiment is featured in using a thin film transistor of a triple gate type at a pixel matrix portion as shown by the constitution of FIG. 3.

That is, a source wiring 25 and the semiconductor layer 02 constitute a contact at a portion of the source electrode 22 and the pixel electrode 24 and the semiconductor layer 02 constitute a contact at a portion of the drain electrode 23. Further, regions 21, 21' and 21" where the meandered and extended gate wiring 26 intersects with the semiconductor layer 02, function as gate electrodes.

The fabrication steps of the embodiment are performed by changing the pattern of the resist mask in the step of patterning the gate wiring of Embodiment 1.

EMBODIMENT 3

Figure 4:
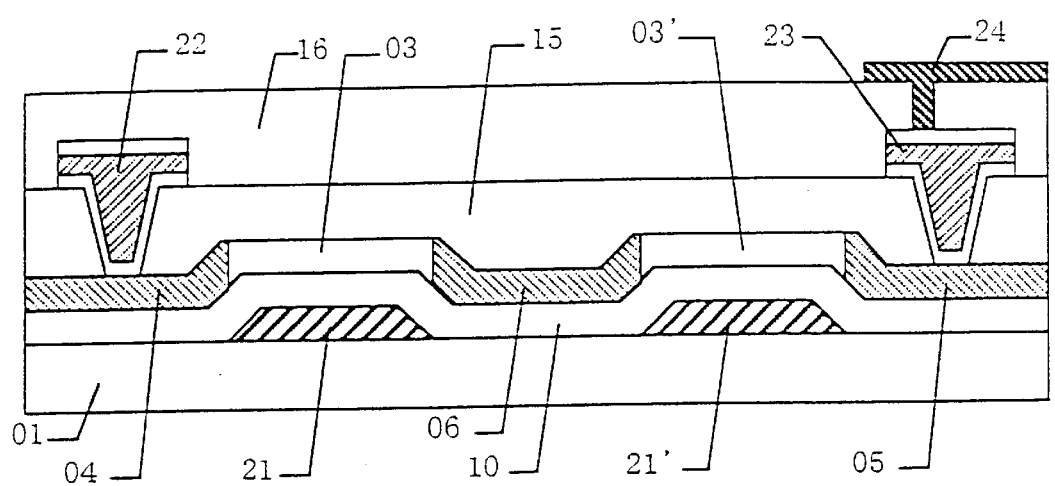
FIG. 4 is a sectional view of a pixel matrix portion constituted by using the present invention.
Figure 5:
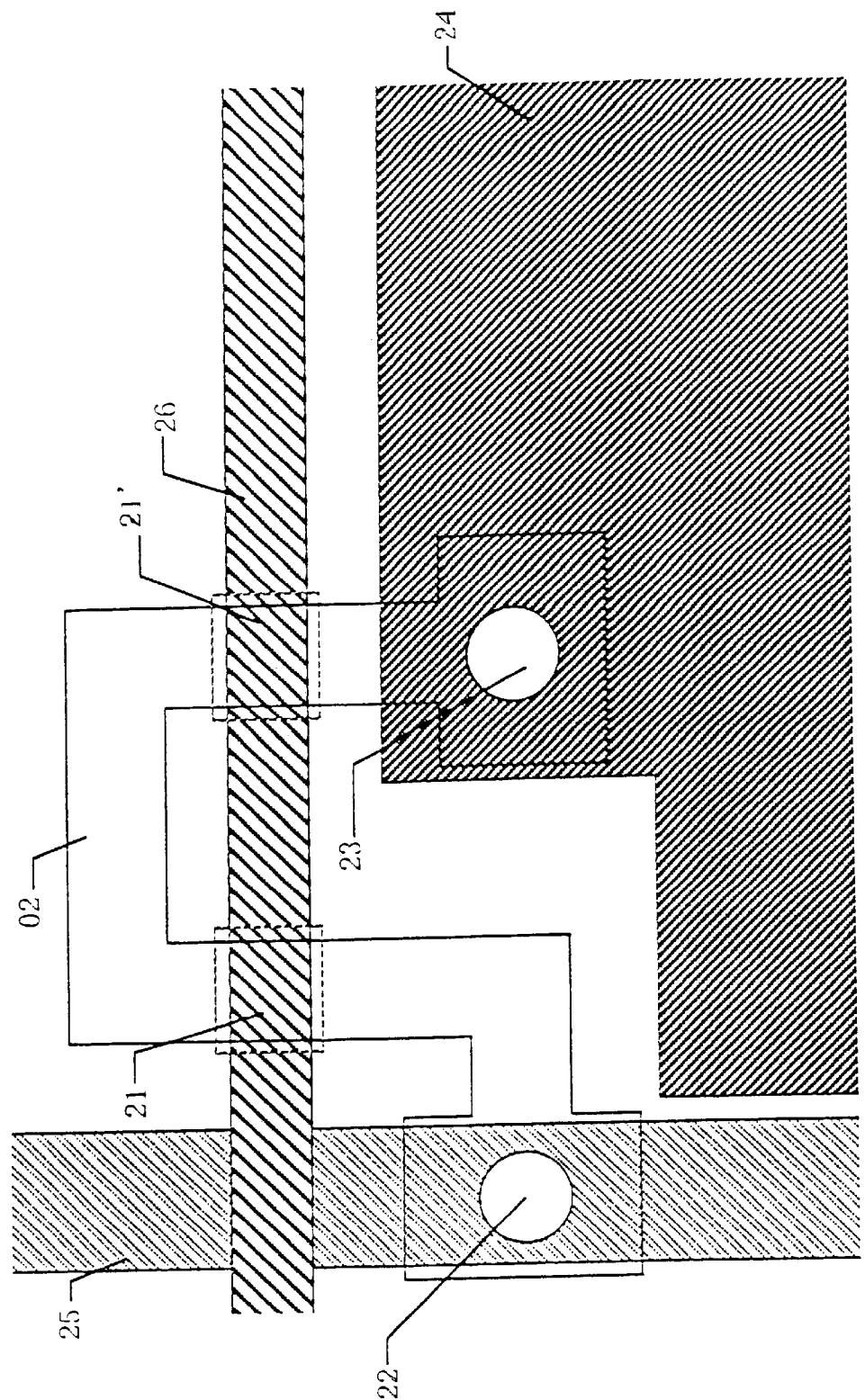
FIG. 5 is a top view of a conventional pixel matrix portion.

The embodiment is an example of using a thin film transistor having the constitution of a bottom gate. FIG. 4 shows the sectional view.

That is, gate electrodes 21 and 21' are present on top of the glass substrate 01, on which the gate insulating film 10 and the semiconductor layer are arranged. The semiconductor layer includes the source region 04, the drain region 05 and the impurity added region 06 which are added with impurities and the I type channel regions 03 and 03'.

Further, the first interlayer insulating film 15 is present thereon and the source electrode 22 in contact with the source region 04 and the drain electrode 23 forming a contact along with the drain region are placed. Further, the second interlayer insulating film 16 is present thereon and the pixel electrode 24 and the drain electrode 23 forms a contact. Although not shown in the drawing, offset regions or lightly doped regions may be formed depending upon the desired characteristics of the transistors.

By using the present invention disclosed in the specification, a semiconductor device having small ON resistance and small power consumption can be provided. Further, a semiconductor device having inconsiderable deterioration of a semiconductor layer and high reliability can be provided.

What is claimed is:

1. An active matrix type display device comprising:
   a pixel portion;
   a plurality of pixels in the pixel portion;
   each of the pixels includes a thin film transistor, said thin film transistor comprising:
   a semiconductor film formed on an insulating surface over an insulating substrate;
   a meandering gate wiring;
   a gate insulating film;
   a plurality of channel regions in the semiconductor film adjacent to the meandering gate wiring with the gate insulating film interposed therebetween,
   a plurality of impurity doped regions at both sides of each of said plurality of channel regions in the semiconductor,
   wherein the meandering gate wiring traverses the semiconductor film a plurality of times,
   and wherein said plurality of channel regions and said plurality of impurity doped regions are arranged in a straight line.

2. A device according to claim 1, wherein the meandering gate wiring comprises a metal.

3. A device according to claim 1, wherein the active matrix type display device is an active matrix type liquid crystal display device.

4. A device according to claim 1, wherein said plurality of impurity doped regions comprise rectangular shapes.

5. A device according to claim 1, wherein the thin film transistor is a bottom gate type thin film transistor.

6. An active matrix type display device comprising:
   a pixel matrix portion;
   a plurality of pixels in the pixel portion;
   a multi-gate type thin film transistor as a switching element in each of the pixels;
   said multi-gate type thin film transistor comprising:
   a semiconductor film formed on an insulating surface over an insulating substrate;
   a meandering gate wiring;
   a gate insulating film;
   a plurality of channel regions in the semiconductor film adjacent to the meandering gate wiring with the gate insulating film interposed therebetween,
   a plurality of impurity doped regions at both sides of each of said plurality of channel regions in the semiconductor,
   wherein the meandering gate wiring traverses the semiconductor film a plurality of times,
   wherein said plurality of channel regions and said plurality of impurity doped regions are arranged in a straight line.

7. A device according to claim 6, wherein the meandering gate wiring comprises a metal.

8. A device according to claim 6, wherein the active matrix type display device is an active matrix type liquid crystal display device.

9. A device according to claim 6, wherein said plurality of impurity doped regions comprise rectangular shapes.

10. A device according to claim 6, wherein the thin film transistor is a bottom gate type thin film transistor.

11. An active matrix type display device comprising:
    a pixel portion;
    a plurality of pixels in the pixel portion;
    a thin film transistor in each of the pixels; said thin film transistor comprising:
    a gate wiring formed on an insulating surface over an insulating substrate;
    a semiconductor film adjacent to the gate wiring, said semiconductor film being formed on an insulating surface over the insulating substrate;
    a gate insulating film interposed between the gate wiring and the semiconductor film;
    a plurality of channel regions in the semiconductor film adjacent to the gate wiring with the gate insulating film interposed therebetween,
    a plurality of impurity doped regions at both sides of each of said plurality of channel regions in the semiconductor,
    wherein the gate wiring is patterned so that the gate wiring, crosses the semiconductor film at least two times,
    wherein said plurality of channel regions and said plurality of impurity dope regions are arranged in a straight line.

12. A device according to claim 11, wherein said plurality of channel regions comprise rectangular shapes.

13. A semiconductor device according to claim 11, wherein the gate wiring is located below the semiconductor film.

14. A device according to claim 11, wherein the active matrix type display device is an active matrix type liquid crystal display device.

15. A device according to claim 11, wherein said plurality of impurity doped regions comprise rectangular shapes.

16. A device according to claim 11, wherein the thin film transistor is a bottom gate type thin film transistor.

17. An active matrix type display device comprising:
    a pixel portion;
    a plurality of pixels in the pixel potion
    a thin film transistor in each of the pixels;
    said thin film transistor comprising:
    a gate wiring formed over an insulating substrate;
    a semiconductor film adjacent to the gate wiring, said semiconductor film being formed on an insulating surface over the insulating substrate;
    a gate insulating film interposed between the gate wiring and the semiconductor film;
    a plurality of channel regions in the semiconductor film adjacent to the gate wiring with the gate insulating film interposed therebetween;
    a plurality of impurity doped regions at both sides of each of said plurality of channel regions in the semiconductor,
    a pixel electrode electrically connected to one of the plurality of impurity doped regions;
    wherein the gate wiring is patterned so that the gate wiring crosses the semiconductor film at least two times,
    wherein said plurality of channel regions and said plurality of impurity doped regions are arranged in a straight line.

18. A device according to claim 17, wherein said plurality of channel regions comprise rectangular shapes.

19. A device according to claim 17, wherein the gate wiring is located below the semiconductor film.

20. A device according to claim 17, wherein the active matrix type display device is an active matrix type liquid crystal display device.

21. A device according to claim 17, wherein said plurality of impurity doped regions comprise rectangular shapes.

22. A device according to claim 17, wherein the thin film transistor is a bottom gate type thin film transistor.

23. A device according to claim 1, wherein the insulating substrate is a glass substrate.

24. A device according to claim 1, wherein the insulating substrate is a quartz substrate.

25. A device according to claim 1, further comprising:
a first interlayer insulating film over the multi-gate type thin film transistor;
at least an electrode electrically connected to the multi-gate type thin film transistor through a first contact hole in the first interlayer insulating film;
a second interlayer insulating film over the multi-gate type thin film transistor, the first interlayer insulating film and the electrode;
a pixel electrode electrically connected to the electrode through a second contact hole in the second interlayer insulating film.

26. A device according to claim 6, wherein the insulating substrate is a glass substrate.

27. A device according to claim 6, wherein the insulating substrate is a quartz substrate.

28. A device according to claim 6, further comprising:
a first interlayer insulating film over the thin film transistor;
at least an electrode electrically connected to the thin film transistor through a first contact hole in the first interlayer insulating film;
a second interlayer insulating film over the thin film transistor, the first interlayer insulating film and the electrode;
a pixel electrode electrically connected to the electrode through a second contact hole in the second interlayer insulating film.

29. A device according to claim 11, wherein the insulating substrate is a quartz substrate.

30. A device according to claim 11, wherein the insulating substrate is a glass substrate.

31. A device according to claim 11, further comprising:
a first interlayer insulating film over the thin film transistor;
at least an electrode electrically connected to the thin film transistor through a first contact hole in the first interlayer insulating film;
a second interlayer insulating film over the thin film transistor, the first interlayer insulating film and the electrode;
a pixel electrode electrically connected to the electrode through a second contact hole in the second interlayer insulating film.

32. A device according to claim 17, wherein the insulating substrate is a glass substrate.

33. A device according to claim 17, wherein the insulating substrate is a quartz substrate.

34. A device according to claim 17, further comprising:
a first interlayer insulating film over the thin film transistor;
at least an electrode electrically connected to the one of the plurality of impurity doped regions through a first contact hole in the first interlayer insulating film;
a second interlayer insulating film over the thin film transistor, the first interlayer insulating film and the electrode;
the pixel electrode electrically connected to the electrode through a second contact hole in the second interlayer insulating film.

35. An active matrix type display device comprising:
a pixel portion;
a plurality of pixels in the pixel portion;
each of the pixels comprises a first thin film transistor and a second thin film transistor electrically connected with said second thin film transistor, each of said first and second thin film transistors comprising:
a semiconductor film formed on an insulating surface over an insulating substrate;
a meandering gate wiring;
a gate insulating film;
a channel region in the semiconductor film adjacent to the meandering gate wiring with the gate insulating film interposed therebetween,
wherein the meandering gate wiring traverses the semiconductor film by a plurality of times,
wherein a channel direction of said channel region in said first thin film transistor coincides with a channel direction of said channel region in said second thin film transistor.

36. A device according to claim 35, wherein the meandering gate wiring comprises a metal.

37. A device according to claim 35, wherein the active matrix type display device is an active matrix type liquid crystal display device.

38. A device according to claim 35, wherein each of said thin film transistors is a bottom gate type thin film transistor.

39. A device according to claim 35, wherein the insulating substrate is a glass substrate.

40. A device according to claim 35, wherein the insulating substrate is a quartz substrate.

41. A device according to claim 35, further comprising:
a first interlayer insulating film over the thin film transistor;
at least an electrode electrically connected to the thin film transistor through a first contact hole in the first interlayer insulating film;
a second interlayer insulating film over the thin film transistor, the first interlayer insulating film and the electrode;
a pixel electrode electrically connected to the electrode through a second contact hole in the second interlayer insulating film.

42. An active matrix type display device comprising:
a pixel matrix portion;
a plurality of pixels in the pixel portion;
a multi-gate type thin film transistor as a switching element in each of the pixels;
said multi-gate type thin film transistor comprising a first thin film transistor and a second thin film transistor electrically connected with said second thin film transistor, each of said first and second thin film transistors comprising:
a semiconductor film formed on an insulating surface over an insulating substrate;
a meandering gate wiring;
a gate insulating film;
a channel region in the semiconductor film adjacent to the meandering gate wiring with the gate insulating film interposed therebetween, wherein the meandering gate wiring traverses the semiconductor film by a plurality of times, wherein a channel direction of said channel region in said first thin film transistor coincides with a channel direction of said channel region in said second thin film transistor.

43. A device according to claim 42, wherein the meandering gate wiring comprises a metal.

44. A device according to claim 42, wherein the active matrix type display device is an active matrix type liquid crystal display device.

45. A device according to claim 42, wherein each of said thin film transistors is a bottom gate type thin film transistor.

46. A device according to claim 42, wherein the insulating substrate is a glass substrate.

47. A device according to claim 42, wherein the insulating substrate is a quartz substrate.

48. A device according to claim 42, further comprising:
a first interlayer insulating film over the multi-gate type thin film transistor;
at least an electrode electrically connected to the multi-gate type thin film transistor through a first contact hole in the first interlayer insulating film;
a second interlayer insulating film over the multi-gate type thin film transistor, the first interlayer insulating film and the electrode;
a pixel electrode electrically connected to the electrode through a second contact hole in the second interlayer insulating film.

49. An active matrix type display device comprising:
a pixel portion;
a plurality of pixels in the pixel portion;
a first thin film transistor and second thin film transistor in each of the pixels;
each of said first and second thin film transistors comprising:
a gate wiring formed on an insulating surface over an insulating substrate;
a semiconductor film adjacent to the gate wiring, said semiconductor film being formed on an insulating surface over the insulating substrate;
a gate insulating film interposed between the gate wiring and the semiconductor film;
a channel region in the semiconductor film adjacent to the gate wiring with the gate insulating film interposed therebetween,
wherein the gate wiring is patterned so that the gate wiring crosses the semiconductor film at least two times,
wherein a channel direction of said channel region in said first thin film transistor coincides with a channel direction of said channel region in said second thin film transistor.

50. A device according to claim 49, wherein the channel region comprises a rectangular shape.

51. A semiconductor device according to claim 49, wherein the gate wiring is located below the semiconductor film.

52. A device according to claim 49, wherein the active matrix type display device is an active matrix type liquid crystal display device.

53. A device according to claim 49, wherein each of said first and second thin film transistors is a bottom gate type thin film transistor.

54. A device according to claim 49, wherein the insulating substrate is a glass substrate.

55. A device according to claim 49, wherein the insulating substrate is a quartz substrate.

56. A device according to claim 49, further comprising:
a first interlayer insulating film over the first and second thin film transistors;
at least an electrode electrically connected to the first thin film transistor through a first contact hole in the first interlayer insulating film;
a second interlayer insulating film over the first and second thin film transistor, the first interlayer insulating film and the electrode;
a pixel electrode electrically connected to the electrode through a second contact hole in the second interlayer insulating film.

57. An active matrix type display device comprising:
a pixel portion;
a plurality of pixels in the pixel potion
first and second thin film transistors in each of the pixels;
each of said first and second thin film transistors comprising:
a gate wiring formed over an insulating substrate;
a semiconductor film adjacent to the gate wiring, said semiconductor film being formed on an insulating surface over the insulating substrate;
a gate insulating film interposed between the gate wiring and the semiconductor film;
a plurality of impurity doped regions formed in the semiconductor film;
a channel region in the semiconductor film adjacent to the gate wiring with the gate insulating film interposed therebetween;
a pixel electrode electrically connected to one of the plurality of impurity doped regions;
wherein the gate wiring is patterned so that the gate wiring crosses the semiconductor film at least two times,
wherein a channel direction of said channel region in said first thin film transistor coincides with a channel direction of said channel region in said second thin film transistor.

58. A device according to claim 57, wherein the channel region comprises a rectangular shape.

59. A device according to claim 57, wherein the gate wiring is located below the semiconductor film.

60. A device according to claim 57, wherein the active matrix type display device is an active matrix type liquid crystal display device.

61. A device according to claim 57, wherein each of said first and second thin film transistors is a bottom gate type thin film transistor.

62. A device according to claim 57, wherein the insulating substrate is a glass substrate.

63. A device according to claim 57, wherein the insulating substrate is a quartz substrate.

64. A device according to claim 57, further comprising:
a first interlayer insulating film over the first and second thin film transistors;
at least an electrode electrically connected to the first thin film transistor through a first contact hole in the first interlayer insulating film;
a second interlayer insulating film over the first and second thin film transistor, the first interlayer insulating film and the electrode;

a pixel electrode electrically connected to the electrode through a second contact hole in the second interlayer insulating film.

65. A device according to claim 1, wherein said plurality of channel regions comprise rectangular shapes.

66. A device according to claim 6, wherein said plurality of channel regions comprise rectangular shapes.

67. A device according to claim 35, wherein said channel region comprises a rectangular shape.

68. A device according to claim 35, wherein impurity dope regions at both side of said channel region comprise rectangular shapes.

69. A device according to claim 49, wherein impurity dope regions at both side of said channel region comprise rectangular shapes.

70. A device according to claim 57, wherein impurity dope regions at both side of said channel region comprise rectangular shapes.

71. A device according to claim 42, wherein impurity channel region at both side of said channel region comprise rectangular shapes.

72. A device according to claim 42, wherein said channel region comprises a rectangular shape.

* * * * *